(12) United States Patent
Liu et al.

(10) Patent No.: US 8,466,854 B2
(45) Date of Patent: Jun. 18, 2013

(54) ORGANIC ELECTRO-LUMINESCENT DEVICE PACKAGE AND FABRICATING METHOD THEREOF

(75) Inventors: Chih-Che Liu, Nantou County (TW); Shih-Feng Hsu, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 381 days.

(21) Appl. No.: 12/838,501

(22) Filed: Jul. 19, 2010

(65) Prior Publication Data
US 2011/0242012 A1 Oct. 6, 2011

(30) Foreign Application Priority Data
Apr. 1, 2010 (TW) .............................. 99110137 A

(51) Int. Cl.
*H01L 27/32* (2006.01)
(52) U.S. Cl.
USPC .................. 345/76; 345/77; 345/78; 345/79; 345/80; 345/81; 345/82; 345/83; 345/204
(58) Field of Classification Search
USPC .............................. 345/76–83, 204; 315/169.3
See application file for complete search history.

(56) References Cited

U.S. PATENT DOCUMENTS

| | | | |
|---|---|---|---|
| 2001/0043046 A1 | 11/2001 | Fukunaga | |
| 2004/0218109 A1* | 11/2004 | Koo et al. | 349/42 |
| 2007/0170855 A1* | 7/2007 | Choi et al. | 313/512 |
| 2007/0176563 A1* | 8/2007 | Kim et al. | 315/169.3 |
| 2008/0111479 A1 | 5/2008 | Choi et al. | |
| 2009/0058292 A1* | 3/2009 | Koo et al. | 313/512 |
| 2010/0007616 A1* | 1/2010 | Jang | 345/173 |
| 2010/0079065 A1 | 4/2010 | Kamiura | |

FOREIGN PATENT DOCUMENTS

| | | |
|---|---|---|
| CN | 1485929 | 3/2004 |
| CN | 101059738 | 10/2007 |
| CN | 101179093 A | 5/2008 |
| CN | 101443414 | 5/2009 |
| JP | 2008-218142 | 9/2008 |
| TW | I255424 | 5/2006 |
| TW | I278134 | 4/2007 |

OTHER PUBLICATIONS

"First Office Action of China Counterpart Application", issued on May 3, 2011, p. 1-p. 7.
"Second Office Action of China Counterpart Application", issued on Jun. 4, 2012, p. 1-p. 7.

* cited by examiner

*Primary Examiner* — Alexander S Beck
*Assistant Examiner* — Jeffrey Steinberg
(74) *Attorney, Agent, or Firm* — Jianq Chyun IP Office

(57) ABSTRACT

An organic electro-luminescent device package includes an organic electro-luminescent device array substrate, a transparent cover, and a frit. The organic electro-luminescent device array substrate includes a first substrate and a plurality of organic electro-luminescent devices arranged on the first substrate in an array. The transparent cover is disposed over the organic electro-luminescent device array substrate. The transparent cover includes a second substrate and a conductive layer disposed on the second substrate. The organic electro-luminescent devices are located between the first substrate and the second substrate. The frit is disposed between the organic electro-luminescent device array substrate and the transparent cover to surround the organic electro-luminescent devices. The frit is located between the first substrate and a portion of the conductive layer, and the portion of the conductive layer corresponding to the frit is transparent.

23 Claims, 2 Drawing Sheets

ORGANIC ELECTRO-LUMINESCENT DEVICE PACKAGE AND FABRICATING METHOD THEREOF

CROSS-REFERENCE TO RELATED APPLICATION

This application claims the priority benefit of Taiwan application serial no. 99110137, filed on Apr. 1, 2010. The entirety of the above-mentioned patent application is hereby incorporated by reference herein and made a part of this specification.

BACKGROUND OF THE INVENTION

1. Field of the Invention

The invention relates to an organic electro-luminescent device package and a method of packaging the same. More particularly, the invention relates to an organic electro-luminescent device package employing a frit and a method of packaging the organic electro-luminescent device package.

2. Description of Related Art

With booming development of electronic products and increasing demands on portable electronic products, more and more attention has been paid to performance of displays on the electronic products in terms of response speed, high resolution, and satisfactory image quality. Research and development of the electronic products are mainly directed to multi-functional properties, light weight, and compactness. An organic electro-luminescent device (OELD) is a self-emissive display in no need of a backlight module, and thus the organic electro-luminescent device satisfies the requirement of the electronic products for light weight and compactness.

Normally, UV curable sealant is used in the organic electro-luminescent device to prevent moisture from entering into an organic electro-luminescent device package. Nevertheless, the insufficient capability of the UV curable sealant for blocking water and oxygen easily deteriorates reliability of the organic electro-luminescent device. According to the related art, a laser frit is irradiated by a laser beam, such that the frit is welded to an upper substrate and a lower substrate, respectively. Thereby, reliability of the organic electro-luminescent device package can be guaranteed. Although water and oxygen can be well blocked by means of the laser frit, the application of the laser frit is restricted because the laser frit must be appropriately irradiated by the laser beam and then welded to the upper and the lower substrates. For instance, when conductive wires arranged on the upper substrate for signal transmission are made of non-transparent metal or metal alloy, the laser beam is likely to be blocked by the non-transparent metal or the metal alloy, which may lead to incomplete laser welding because the laser frit cannot be well irradiated by the laser beam. As such, water and oxygen cannot be effectively blocked due to the incomplete laser welding, and the life span and performance of the organic electro-luminescent device are further affected.

SUMMARY OF THE INVENTION

The invention is directed to an organic electro-luminescent device package having a conductive layer that allows a laser beam to pass through.

The invention is further directed to a fabricating method of an organic electro-luminescent device package to effectively alleviate process difficulty in laser package technology.

In the invention, an organic electro-luminescent device package is provided. The organic electro-luminescent device package includes an organic electro-luminescent device array substrate, a transparent cover, and a frit. The organic electro-luminescent device array substrate includes a first substrate and a plurality of organic electro-luminescent devices arranged on the first substrate in an array. The transparent cover is disposed over the organic electro-luminescent device array substrate. The transparent cover includes a second substrate and a conductive layer disposed on the second substrate. The organic electro-luminescent devices are located between the first substrate and the second substrate. The frit is disposed between the organic electro-luminescent device array substrate and the transparent cover to surround the organic electro-luminescent devices. Here, the frit is located between the first substrate and a portion of the conductive layer, and the portion of the conductive layer corresponding to the frit is transparent.

According to an embodiment of the invention, the organic electro-luminescent devices include a plurality of organic electro-luminescent diodes.

According to an embodiment of the invention, the organic electro-luminescent device array substrate includes an active matrix organic electro-luminescent device array substrate or a passive matrix organic electro-luminescent device array substrate.

According to an embodiment of the invention, the transparent cover includes a glass cover.

According to an embodiment of the invention, the conductive layer includes a touch-sensing circuit.

According to an embodiment of the invention, a material of the conductive layer includes transparent conductive oxides.

According to an embodiment of the invention, the organic electro-luminescent devices and the conductive layer are located between the first substrate and the second substrate.

According to an embodiment of the invention, the second substrate is located between the organic electro-luminescent devices and the conductive layer.

According to an embodiment of the invention, the frit includes a glass frit.

According to an embodiment of the invention, a material of the frit includes an organic material and a plurality of oxide particles. The oxide particles are doped in the organic material, and the oxide particles include metal oxides, oxides of a transitional element, or a combination thereof. Here, diameters of the oxide particles range from about 1 µm to about 5 µm, for example.

According to an embodiment of the invention, the frit is suitable for being irradiated by a laser beam having a wavelength ranging from about 800 nm to about 1000 nm, so as to laser weld the frit to the organic electro-luminescent device array substrate or the transparent cover.

In the invention, a method of fabricating an organic electro-luminescent device package is provided. The fabricating method is described below. An organic electro-luminescent device array substrate is provided. A frit is formed on a transparent cover. The transparent cover has a conductive layer. The transparent cover and the organic electro-luminescent device array substrate are assembled, such that the frit is located between the organic electro-luminescent device array substrate and the transparent cover. The frit is irradiated by a laser beam having a wavelength ranging from about 800 nm to about 1000 nm to laser weld the frit to the organic electro-luminescent device array substrate.

Based on the above, the portion of the conductive layer corresponding to the frit is transparent, and therefore the process difficulty in packaging the organic electro-luminescent device package by employing the laser package technology can be alleviated, and feasibility of the laser package technology is improved.

It is to be understood that both the foregoing general descriptions and the following detailed embodiments are exemplary and are, together with the accompanying drawings, intended to provide further explanation of technical features and advantages of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
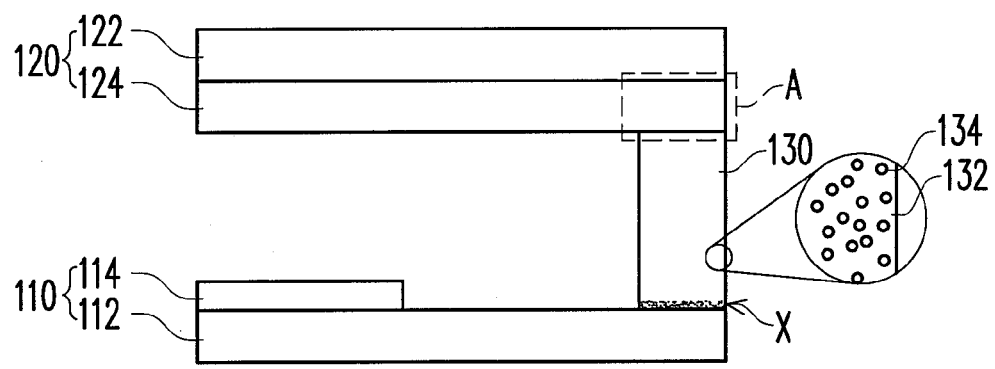
FIG. 1 is a schematic cross-sectional view illustrating an organic electro-luminescent device package according to an embodiment of the invention.

FIG. 1 is a schematic cross-sectional view illustrating an organic electro-luminescent device package according to an embodiment of the invention. As shown in FIG. 1, an organic electro-luminescent device package 100 of this embodiment includes an organic electro-luminescent device array substrate 110, a transparent cover 120, and a frit 130. The organic electro-luminescent device array substrate 110 includes a first substrate 112 and a plurality of organic electro-luminescent devices 114 arranged on the first substrate 112 in an array. Note that only one of the organic electro-luminescent devices 114 is illustrated in FIG. 1 for description. The first substrate 112 is, for example, a glass substrate, and the organic electro-luminescent devices 114 are, for example, organic electro-luminescent diodes. Certainly, the organic electro-luminescent device array substrate 110 can be an active matrix organic electro-luminescent device array substrate or a passive matrix organic electro-luminescent device array substrate based on different driving manner. For instance, each of the organic electro-luminescent devices 114 in the active matrix organic electro-luminescent device array substrate is formed by an active device and an organic electro-luminescent diode electrically connected to the active device, and the light emission properties of the organic electro-luminescent diode are controlled by the active device.

In FIG. 1, the transparent cover 120 is disposed over the organic electro-luminescent device array substrate 110. Here, the transparent cover 120 is a glass cover, for example. The transparent cover 120 includes a second substrate 122 and a conductive layer 124 located on the second substrate 122. The organic electro-luminescent devices 114 are located between the first substrate 112 and the second substrate 122. According to this embodiment, the organic electro-luminescent devices 114 and the conductive layer 124 are located between the first substrate 112 and the second substrate 122. Specifically, the conductive layer 124 is, for example, a touch-sensing circuit. That is to say, the conductive layer 124 of this embodiment is an in-cell touch-sensing panel, for example. The conductive layer 124 can also be other types of conductive circuits, which is determined based on product demands.

A material of the conductive layer 124 is, for example, transparent conductive oxides. The material of the conductive layer 124 and the structure thereof should not be construed as limitations to this invention.

As indicated in FIG. 1, the frit 130 is disposed between the organic electro-luminescent device array substrate 110 and the transparent cover 120 to surround the organic electro-luminescent devices 114. In this embodiment, the frit 130 is suitable for being irradiated by a laser beam having a wavelength ranging from about 800 nm to about 1000 nm, so as to laser weld the frit 130 to the organic electro-luminescent device array substrate 110 or the transparent cover 120. The frit 130 is located between the first substrate 112 and a portion of the conductive layer 124, and the portion of the conductive layer 124 corresponding to the frit 130 is transparent. In particular, the portion of the conductive layer 124 located between the second substrate 122 and the frit 130 is transparent according to this embodiment, as shown by a portion A in FIG. 1. Thereby, when the organic electro-luminescent device array substrate 110 and the transparent substrate 120 in the organic electro-luminescent device package 100 are laser welded, the laser beam can be easily transmitted through the second substrate 122 and the conductive layer 124 to a contact portion between the conductive layer 124 and the frit 130 and to a contact portion between the first substrate 112 and the frit 130. After the contact portion between the conductive layer 124 and the frit 130 and the contact portion between the first substrate 112 and the frit 130 absorb energy from the laser beam, a microstructure change is made to these two contact portions. For instance, as shown by a portion X in FIG. 1, after the contact portion between the first substrate 112 and the frit 130 absorbs the laser beam energy, a black laser welding trace occurs.

In addition, in case that the first substrate 112 and/or the second substrate 122 are/is, for example, the glass substrate, and that the frit 130 is, for example, a glass frit, hardness of the frit 130 is similar to hardness of the first substrate 112 and hardness of the second substrate 122. As such, adhesion among the first substrate 112, the second substrate 122, and the frit 130 can be enhanced according to this embodiment, which should not be construed as a limitation to this invention. In other embodiments, given that the first substrate 112 and/or the second substrate 122 are/is, for example, made of a polymer material, the hardness of the frit 130 may not be similar to the hardness of the first substrate 112 or the hardness of the second substrate 122. According to an embodiment, a material of the frit 130 includes an organic material 132 and a plurality of oxide particles 134 doped in the organic material 132. Wherein the organic material may be include polymer, colloid, adhesion material, or other suitable materials. Besides, the oxide particles 134 include metal oxides, oxides of a transitional element, or a combination thereof. Diameters of the oxide particles 134 range from about 1 μm to about 5 μm, for example A material of the oxide particles 134 is, $V_2O_5$, $SiO_2$, $Al_2O_3$, for example, and a material of the organic material 132 is alcohol-ester (such as texanol alcohol-ester), ethyl cellulose (such as ethyl cellulose T100), and so on. The frit 130 which is made of the aforesaid material is characterized by favorable capacity of water and oxygen prevention. For instance, the frit 130 made of the aforesaid material has a water/oxygen vapor transmission rate (WVTR/OTR) less than or equal to about $1\times10^{-5}$ g/m$^2$xday.

Figure 2:
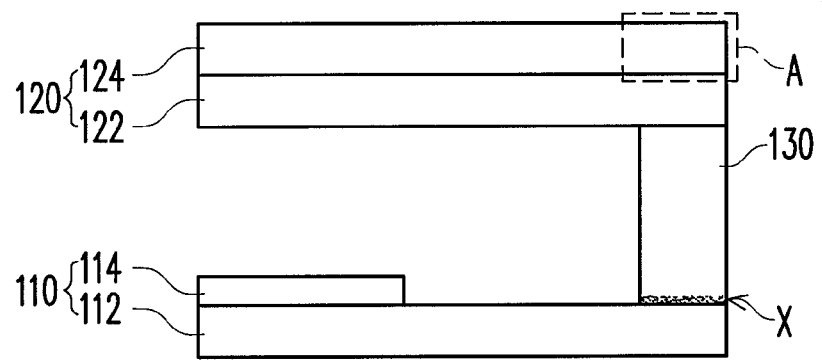
FIG. 2 is a schematic cross-sectional view illustrating an organic electro-luminescent device package according to another embodiment of the invention.

FIG. 2 is a schematic cross-sectional view illustrating an organic electro-luminescent device package according to another embodiment of the invention. As shown in FIG. 2, an organic electro-luminescent device package 200 of this embodiment is similar to the organic electro-luminescent device package 100 depicted in FIG. 1, and therefore same components therein are represented by the same reference numbers or symbols. However, in this embodiment, the second substrate 122 is located between the organic electro-luminescent devices 114 and the conductive layer 124. Specifically, a portion of the conductive layer 124 located right above the frit 130 is transparent. Besides, the conductive layer 124 of this embodiment is an on-cell touch-sensing circuit, for instance. Note that the conductive layer 124 can also be other circuits rather than the touch-sensing circuit, which is determined based on the product demands. Additionally, other components of the organic electro-luminescent device package 200 are the same as the components of the organic electro-luminescent device package 100 illustrated in FIG. 1, and therefore the relevant descriptions provided above are omitted herein.

Figure 3A:
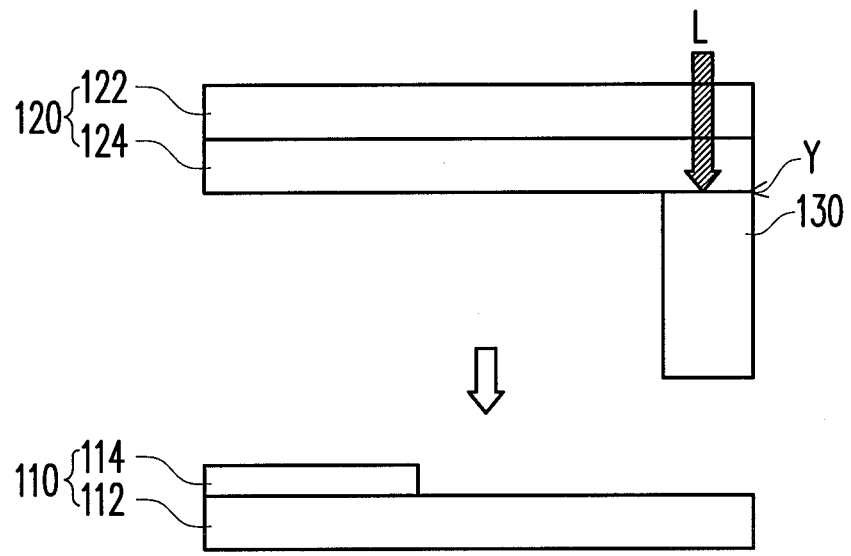
FIG. 3A-FIG. 3B illustrate a method of fabricating an organic electro-luminescent device package according to an embodiment of the invention.
Figure 3B:
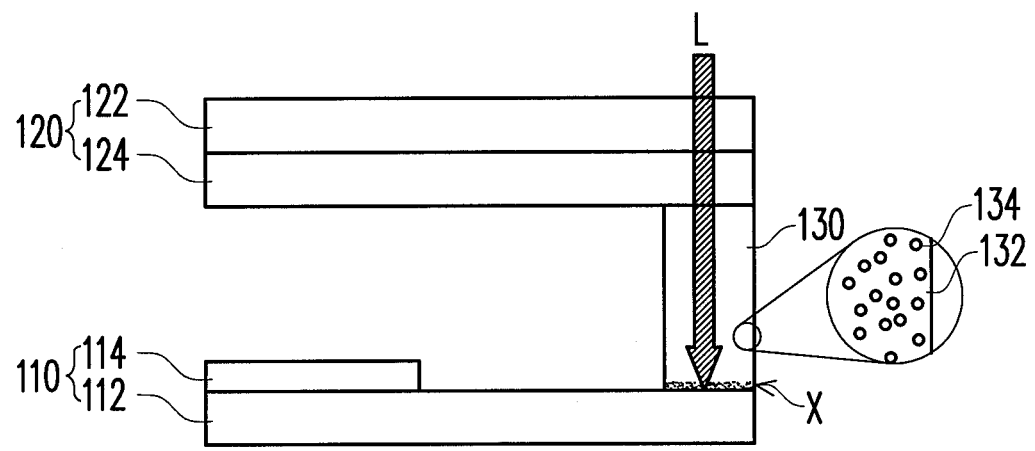

FIG. 3A-FIG. 3B illustrate a method of fabricating an organic electro-luminescent device package according to an embodiment of the invention. In FIG. 3A, an organic electro-luminescent device array substrate 110 and a transparent cover 120 are provided. A first substrate 112 and a plurality of organic electro-luminescent devices 114 arranged on the first substrate 112 in an array are disposed on the organic electro-luminescent device array substrate 110. The transparent cover 120 has a second substrate 122 and a conductive layer 124 located on the second substrate 122. In this embodiment, the first and the second substrates 112 and 122 are, for example, glass substrates, plastic substrates, or substrates made of other materials.

A frit 130 is formed on the transparent cover 120. Hardness of the frit 130 is similar to hardness of the first substrate 112 and hardness of the second substrate 122. According to this embodiment, the frit 130 is formed on the conductive layer 124 of the transparent cover 120, while the frit 130 can be formed on the second substrate 122 of the transparent cover 120, which is not limited in this invention.

When the frit 130 is formed on the transparent cover 120, it should be mentioned that a contact portion Y between the frit 130 and the transparent cover 120 can be irradiated by a laser beam L which passes through the transparent cover 120, such that the frit 130 is welded to the transparent cover 120, and that the frit 130 is initially cured.

In FIG. 3B, the transparent cover 120 and the organic electro-luminescent device array substrate 110 are assembled, such that the frit 130 is located between the organic electro-luminescent device array substrate 110 and the transparent cover 120. The frit 130 is irradiated by the laser beam L having a wavelength ranging from about 800 nm to about 1000 nm, so as to laser weld the frit 130 to the organic electro-luminescent device array substrate 110. Thereby, the organic electro-luminescent device package 300 is formed. As described above, a black welding trace X is formed at the bonding portion between the organic electro-luminescent device array substrate 110 and the frit 130 after the frit 130 is irradiated by the laser beam L.

Note that a portion of the conductive layer 124 located between the second substrate 122 and the frit 130 is, for example, transparent. Accordingly, by applying the method of fabricating the organic electro-luminescent device package of this invention, the laser beam is not blocked or absorbed by the conductive layer on the transparent cover, such that the laser package technology is applicable, and that the process difficulty in the laser package technology is alleviated. What is more, the organic electro-luminescent device array substrate and the transparent cover can be well welded by the frit. In light of the foregoing, damages to the organic electro-luminescent devices because of external moisture and oxygen can be effectively prevented in this invention, and device properties of the organic electro-luminescent device package can be further improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An organic electro-luminescent device package comprising:
    an organic electro-luminescent device array substrate comprising a first substrate and a plurality of organic electro-luminescent devices arranged on the first substrate in an array;
    a transparent cover disposed over the organic electro-luminescent device array substrate, wherein the transparent cover comprises a second substrate and a conductive layer disposed on the second substrate, and the organic electro-luminescent devices are located between the first substrate and the second substrate; and
    a frit disposed between the organic electro-luminescent device array substrate and the transparent cover to surround the organic electro-luminescent devices, wherein the frit is located between the first substrate and a portion of the conductive layer, and a portion of the conductive layer corresponding to the frit is transparent,
    wherein a material of the frit comprises an organic material and a plurality of oxide particles doped in the organic material, the oxide particles comprise metal oxides, oxides of a transitional element, or a combination thereof, and diameters of the oxide particles range from about 1 µm to about 5 µm.

2. The organic electro-luminescent device package of claim 1, wherein the organic electro-luminescent devices comprise a plurality of organic electro-luminescent diodes.

3. The organic electro-luminescent device package of claim 1, wherein the organic electro-luminescent device array substrate comprises an active matrix organic electro-luminescent device array substrate or a passive matrix organic electro-luminescent device array substrate.

4. The organic electro-luminescent device package of claim 1, wherein the transparent cover comprises a glass cover.

5. The organic electro-luminescent device package of claim 1, wherein the conductive layer comprises a touch-sensing circuit.

6. The organic electro-luminescent device package of claim 1, wherein a material of the conductive layer comprises transparent conductive oxides.

7. The organic electro-luminescent device package of claim 1, wherein the organic electro-luminescent devices and the conductive layer are located between the first substrate and the second substrate.

8. The organic electro-luminescent device package of claim 1, wherein the second substrate is located between the organic electro-luminescent devices and the conductive layer.

9. The organic electro-luminescent device package of claim 1, wherein the frit comprises a glass frit.

10. The organic electro-luminescent device package of claim 1, wherein the frit is suitable for being irradiated by a laser beam having a wavelength ranging from about 800 nm to about 1000 nm, so as to laser weld the frit to the organic electro-luminescent device array substrate or the transparent cover.

11. A method of fabricating an organic electro-luminescent device package, comprising:
   providing an organic electro-luminescent device array substrate;
   forming a frit on a transparent cover, the transparent cover having a conductive layer;
   assembling the transparent cover and the organic electro-luminescent device array substrate, such that the frit is located between the organic electro-luminescent device array substrate and the transparent cover; and
   irradiating the frit with a laser beam having a wavelength ranging from about 800 nm to about 1000 nm to laser weld the frit to the organic electro-luminescent device array substrate, wherein a black welding trace occurs after the frit is irradiated by the laser beam.

12. An organic electro-luminescent device package comprising:
   an organic electro-luminescent device array substrate comprising a first substrate and a plurality of organic electro-luminescent devices arranged on the first substrate in an array;
   a transparent cover disposed over the organic electro-luminescent device array substrate, wherein the transparent cover comprises a second substrate and a conductive layer disposed on the second substrate, and the organic electro-luminescent devices are located between the first substrate and the second substrate; and
   a frit disposed between the organic electro-luminescent device array substrate and the transparent cover to surround the organic electro-luminescent devices, wherein the frit is located between the first substrate and a portion of the conductive layer, a portion of the conductive layer corresponding to the frit is transparent, and the frit has a black welding trace.

13. The organic electro-luminescent device package of claim 12, wherein the organic electro-luminescent devices comprise a plurality of organic electro-luminescent diodes.

14. The organic electro-luminescent device package of claim 12, wherein the organic electro-luminescent device array substrate comprises an active matrix organic electro-luminescent device array substrate or a passive matrix organic electro-luminescent device array substrate.

15. The organic electro-luminescent device package of claim 12, wherein the transparent cover comprises a glass cover.

16. The organic electro-luminescent device package of claim 12, wherein the conductive layer comprises a touch-sensing circuit.

17. The organic electro-luminescent device package of claim 15, wherein a material of the conductive layer comprises transparent conductive oxides.

18. The organic electro-luminescent device package of claim 12, wherein the organic electro-luminescent devices and the conductive layer are located between the first substrate and the second substrate.

19. The organic electro-luminescent device package of claim 12, wherein the second substrate is located between the organic electro-luminescent devices and the conductive layer.

20. The organic electro-luminescent device package of claim 12, wherein the frit comprises a glass frit.

21. The organic electro-luminescent device package of claim 12, wherein a material of the frit comprises:
   an organic material; and
   a plurality of oxide particles doped in the organic material, the oxide particles comprising metal oxides, oxides of a transitional element, or a combination thereof.

22. The organic electro-luminescent device package of claim 21, wherein diameters of the oxide particles range from about 1 μm to about 5 μm.

23. The organic electro-luminescent device package of claim 12, wherein the frit is suitable for being irradiated by the laser beam having a wavelength ranging from about 800 nm to about 1000 nm, so as to laser weld the frit to the organic electro-luminescent device array substrate or the transparent cover.

* * * * *